(12) United States Patent
Cowan

(10) Patent No.: US 9,542,866 B1
(45) Date of Patent: Jan. 10, 2017

(54) DEVICE SCREEN PROTECTOR ARTICLE

(71) Applicant: Randy G. Cowan, Sioux Falls, SD (US)

(72) Inventor: Randy G. Cowan, Sioux Falls, SD (US)

(*) Notice: Subject to any disclaimer, the term of this patent is extended or adjusted under 35 U.S.C. 154(b) by 0 days.

(21) Appl. No.: 14/679,452

(22) Filed: Apr. 6, 2015

Related U.S. Application Data

(63) Continuation-in-part of application No. 14/078,054, filed on Nov. 12, 2013, now Pat. No. 9,001,502.

(51) Int. Cl.
| | |
|---|---|
| *H05K 5/00* | (2006.01) |
| *H05K 7/00* | (2006.01) |
| *G09F 3/00* | (2006.01) |
| *H05K 5/03* | (2006.01) |
| *G09F 3/10* | (2006.01) |
| *G06F 1/16* | (2006.01) |
| *G09F 3/02* | (2006.01) |

(52) U.S. Cl.
CPC ........... *G09F 3/0288* (2013.01); *G06F 1/1633* (2013.01); *G09F 3/10* (2013.01); *H05K 5/03* (2013.01); *G09F 2003/023* (2013.01); *G09F 2003/0208* (2013.01); *G09F 2003/0225* (2013.01); *G09F 2003/0247* (2013.01); *G09F 2003/0257* (2013.01); *G09F 2003/0276* (2013.01)

(58) Field of Classification Search
CPC ...................................................... G06F 1/1626
USPC ........................................ 361/679.01–679.03
See application file for complete search history.

(56) References Cited

U.S. PATENT DOCUMENTS

| | | | |
|---|---|---|---|
| 2002/0180907 A1 | 12/2002 | Imamura | |
| 2011/0096477 A1 | 4/2011 | Wang | |
| 2012/0046080 A1* | 2/2012 | Koh | H04M 1/0283 455/566 |
| 2012/0159774 A1* | 6/2012 | Foght | H04M 1/0283 29/701 |
| 2013/0033808 A1 | 2/2013 | Cohen | |
| 2013/0059117 A1* | 3/2013 | Hill | G06F 1/1626 428/138 |

FOREIGN PATENT DOCUMENTS

| | | |
|---|---|---|
| WO | 2004114342 | 12/2004 |
| WO | 2011101933 | 8/2011 |

* cited by examiner

*Primary Examiner* — Jerry Wu
(74) *Attorney, Agent, or Firm* — Jeffrey A. Proehl; Woods Fuller Shultz & Smith P.C.

(57) ABSTRACT

An article for protecting a display screen of an electronic device with a display surface. The article may comprise a substrate configured to cover the screen of the device during us of the device, at least a portion of the substrate being substantially transparent to permit viewing of the display surface through the substrate. The substrate may have a perimeter, an outer surface for facing outwardly from the display surface when the substrate is applied to the display surface, and an inner surface for facing toward the display surface when the substrate is applied to the display surface. The article may comprise at least one marking on the substrate.

18 Claims, 5 Drawing Sheets

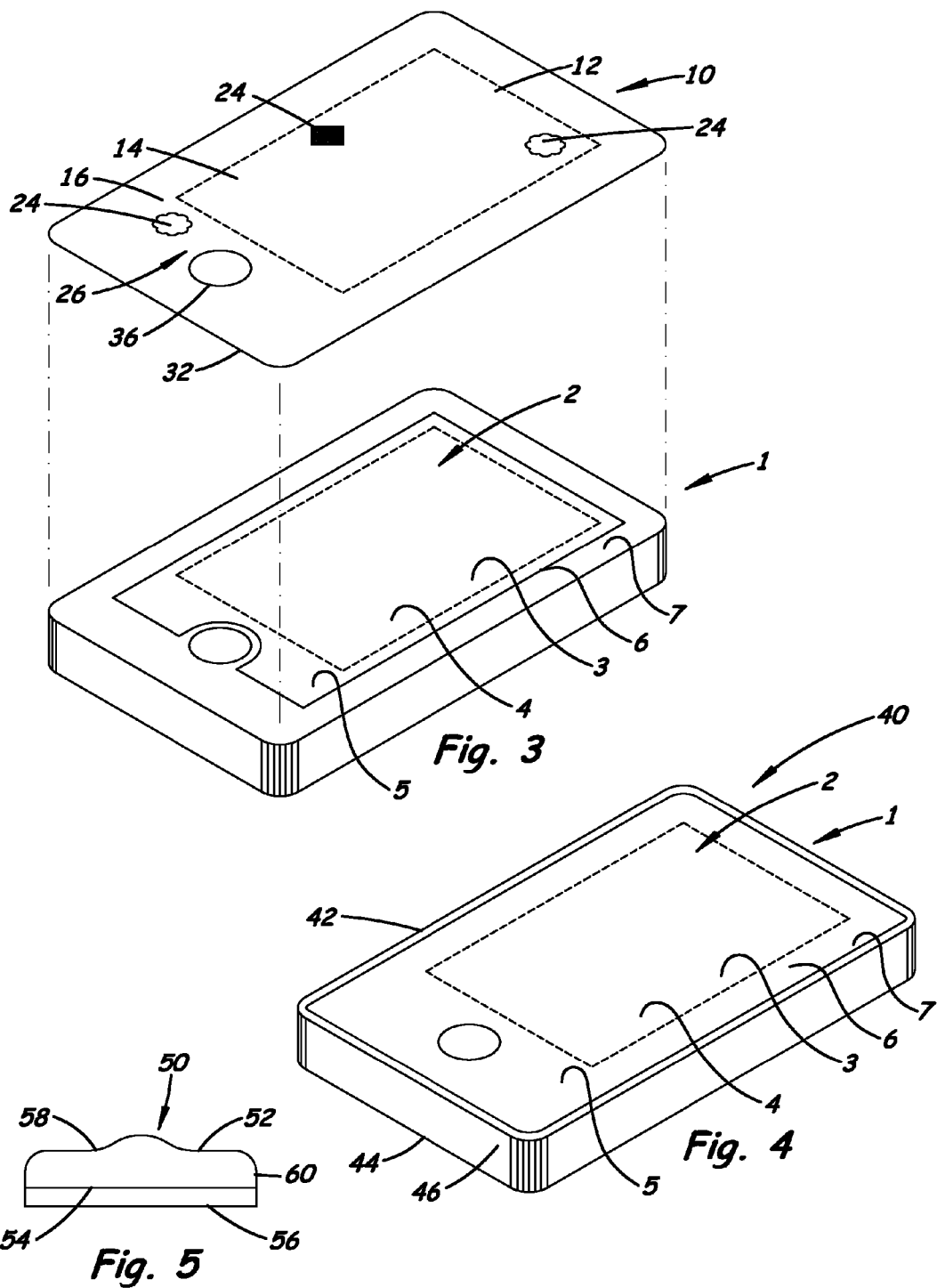

DEVICE SCREEN PROTECTOR ARTICLE

REFERENCE TO RELATED APPLICATION

This application is a continuation-in-part of U.S. patent application Ser. No. 14/078,054, filed Nov. 12, 2013, which is hereby incorporated by reference in its entirety.

BACKGROUND

Field

The present disclosure relates to screen protectors and more particularly pertains to a new device screen protector article for non-permanently displaying markings on the screen of an electronic device.

SUMMARY

In one aspect, the present disclosure relates to an article for protecting a display screen of an electronic device, with the display screen having a display surface. The article may comprise a substrate configured to cover the screen of the device during us of the device, and at least a portion of the substrate may be substantially transparent to permit viewing of the display surface through the substrate. The substrate may have a perimeter, an outer surface for facing outwardly from the display surface when the substrate is applied to the display surface, and an inner surface for facing toward the display surface when the substrate is applied to the display surface. The article may also include at least one marking on the substrate.

In another aspect of the disclosure, an electronic device system may comprise an electronic device having a display screen with a display surface. The display screen may have a display zone capable of displaying a changeable image and a non-display zone incapable of displaying a non-changeable image, with the display zone of the display surface being illuminable by a source of illumination of the display screen. The system may also include an article for protecting the display screen that may comprise a substrate removably applied to the display screen of the device during use of the device, with at least a portion of the substrate being substantially transparent to permit viewing of the display surface through the substrate. The substrate has a perimeter, an outer surface for facing outwardly from the display surface when the substrate is applied to the display surface, and an inner surface for facing toward the display surface when the substrate is applied to the display surface. The substrate has a display region covering the display zone of the display screen and a non-display region covering the non-display zone of the display screen. The article may also include at least one marking on the substrate.

In still another aspect, the disclosure is directed to a system for adorning an electronic communication device having a case including a display screen on a front face of the case, with the case further including a rear face opposite of the front face. The system may comprise a carrier having a carrier surface, and a plurality of decorative stickers for adorning the device, with each sticker of the plurality of decorative stickers having a front surface and a rear surface. The rear surface may have an adhesive for adhering the sticker to a surface, and the adhesive of the stickers may be adhered to the carrier surface of the carrier. The stickers may be configured for mounting on the case of the device, and the front surface of a said sticker having a decorative marking thereon. The system may also include a screen protector article for protecting the screen of the device, with the screen protector being adhered to the carrier surface of the carrier and being peelable from the carrier surface.

There has thus been outlined, rather broadly, some of the more important elements of the disclosure in order that the detailed description thereof that follows may be better understood, and in order that the present contribution to the art may be better appreciated. There are additional elements of the disclosure that will be described hereinafter and which will form the subject matter of the claims appended hereto.

In this respect, before explaining at least one embodiment or implementation in greater detail, it is to be understood that the scope of the disclosure is not limited in its application to the details of construction and to the arrangements of the components set forth in the following description or illustrated in the drawings. The disclosure is capable of other embodiments and implementations and is thus capable of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present disclosure. It is important, therefore, that the claims be regarded as including such equivalent constructions insofar as they do not depart from the spirit and scope of the present disclosure.

The advantages of the various embodiments of the present disclosure, along with the various features of novelty that characterize the disclosure, are disclosed in the following descriptive matter and accompanying drawings.

BRIEF DESCRIPTION OF THE DRAWINGS

The disclosure will be better understood and when consideration is given to the drawings and the detailed description which follows. Such description makes reference to the annexed drawings wherein:

FIG. 3 is a schematic exploded perspective view of an embodiment of the screen protector article and illustrative device on which the article may be employed, according to the present disclosure.

FIG. 4 is a schematic perspective view a device and a cover for the device, according to the present disclosure.

FIG. 5 is a schematic side view of a sticker of the system, according to the present disclosure.

DETAILED DESCRIPTION

Figure 1:
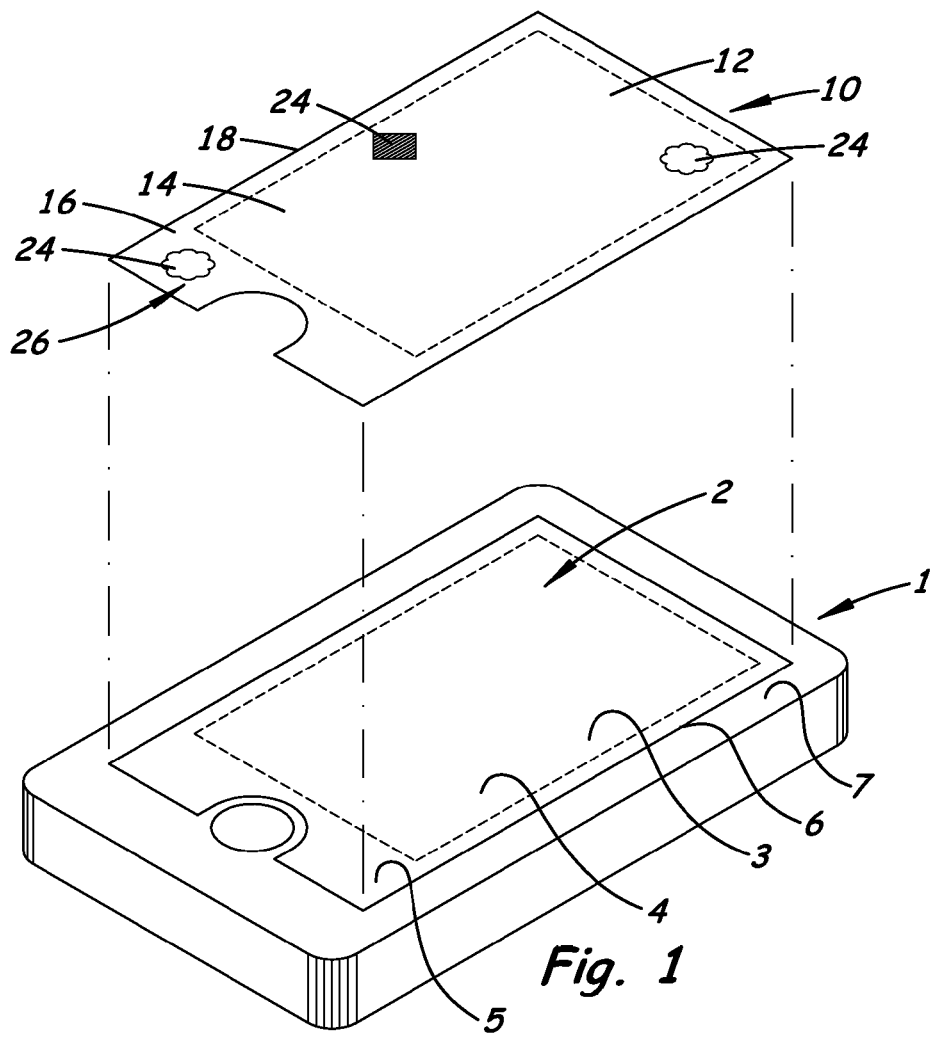
FIG. 1 is a schematic exploded perspective view of a new device screen protector article and an illustrative device on which the article may be employed, according to the present disclosure.
Figure 2:
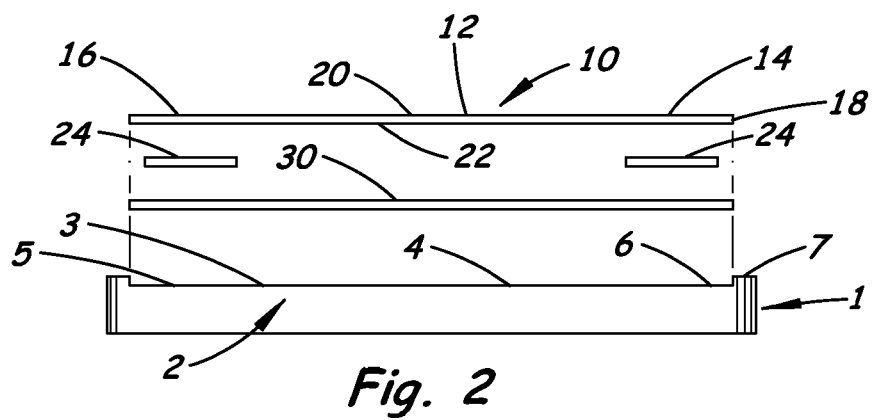
FIG. 2 is a schematic exploded side view of the article and an illustrative device, according to an illustrative embodiment.
Figure 6:
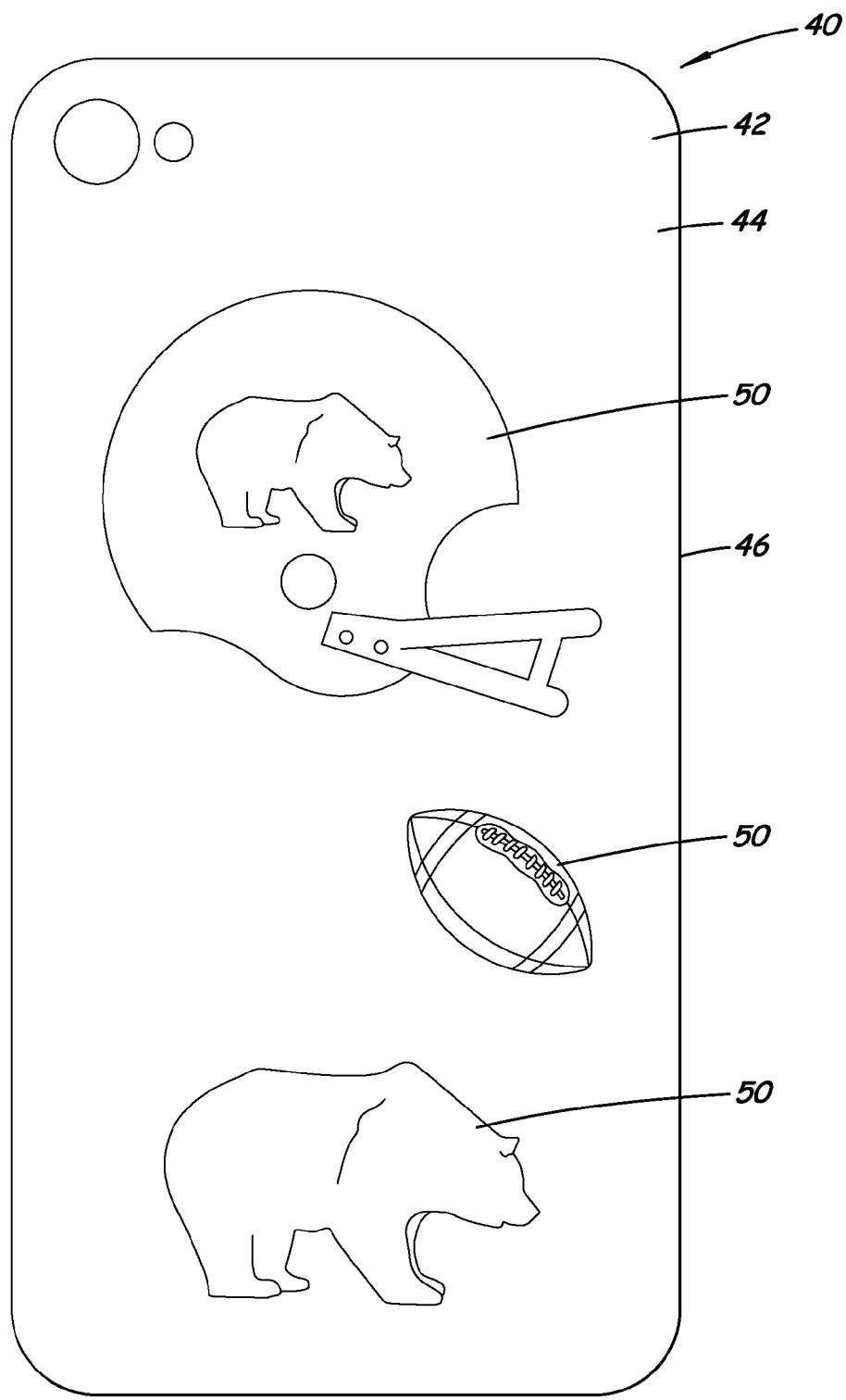
FIG. 6 is a schematic rear view of the cover with stickers of the system applied thereto, according to the present disclosure.
Figure 7:
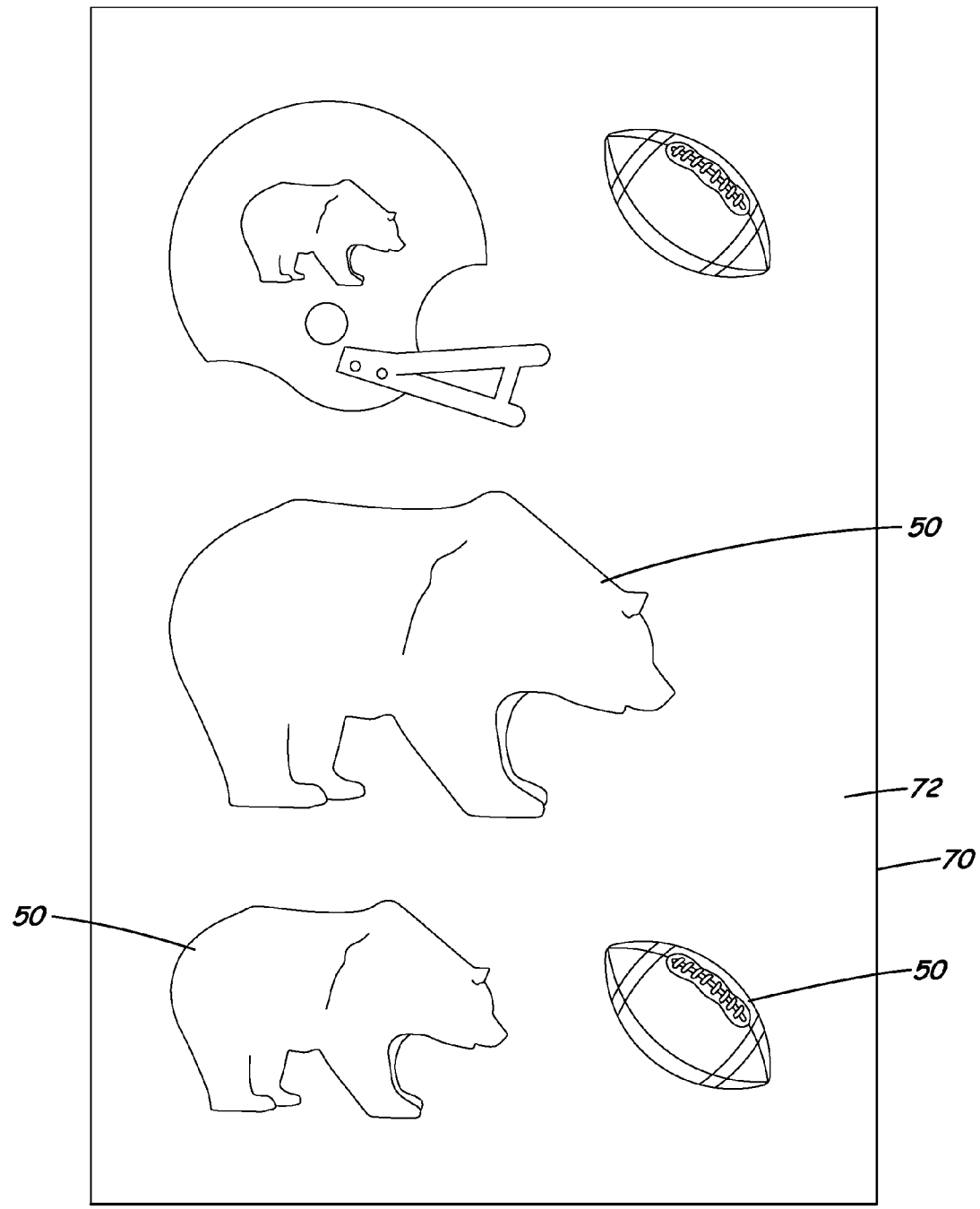
FIG. 7 is a schematic front view of a carrier having stickers removably applied thereon, according to the present disclosure.
Figure 8:
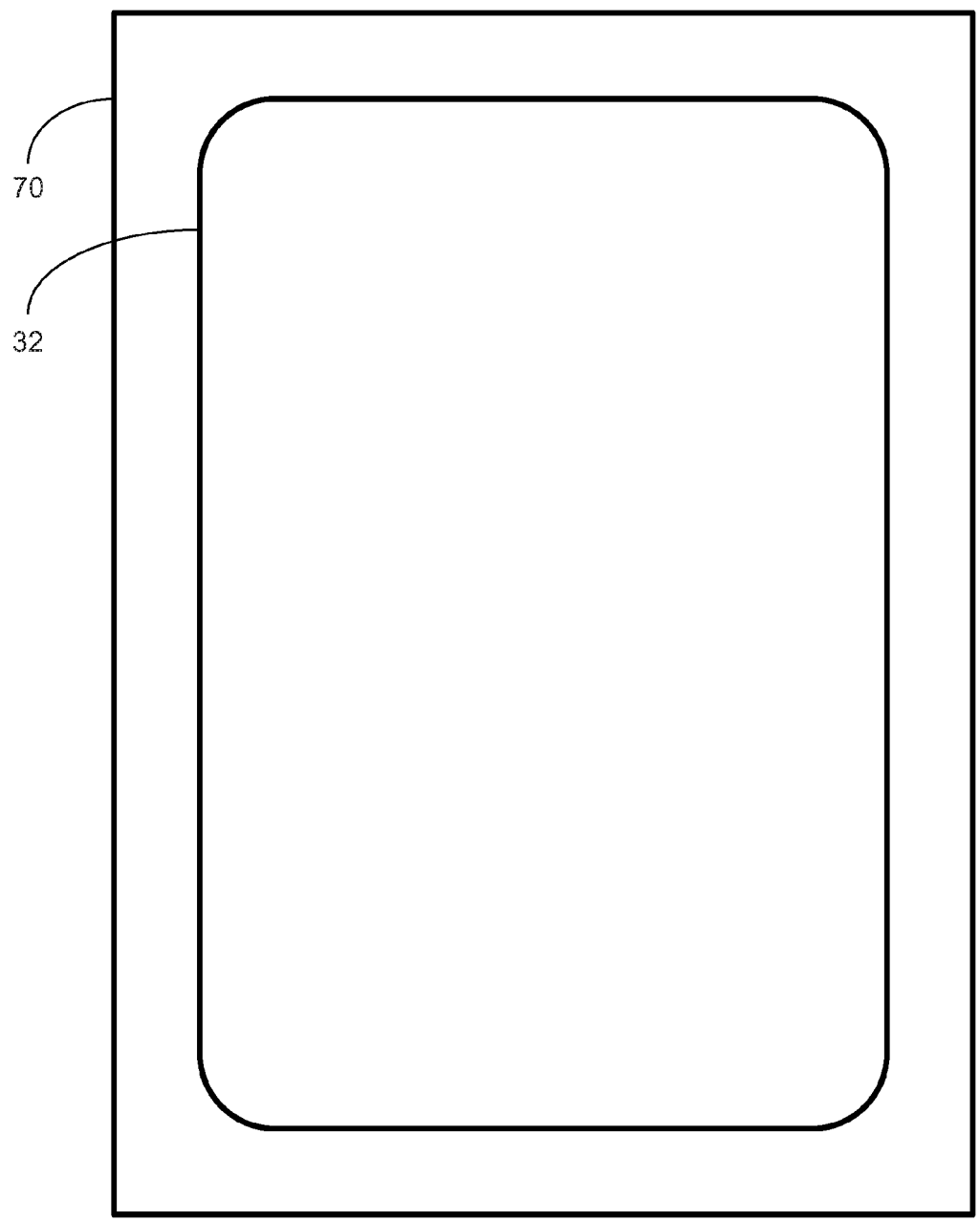
FIG. 8 is a schematic front view of a carrier having a protector article removably applied thereon, according to the present disclosure.

With reference now to the drawings, and in particular to FIGS. 1 through 8, a new device screen protector article embodying the principles and concepts of the disclosed subject matter will be described.

Applicant has recognized that overlays include those that are applied to an outer surface of a device, which may include the display screen of the device, and have been employed to protect the device from scratching and marring during and after the manufacturing process as well as during transport prior to the ultimate utilization by the consumer who removes the overlays in order to use the device. Also, overlays have been utilized on display screens of devices that include indicia that simulate the characters and icons that are typically displayed once power has been supplied to the device and it is operational, in order to provide a potential purchaser with an appearance that simulates the appearance of the display when the device is in an operational state. None of these overlays is intended to be left on the display surface of the display screen when the device is being used, and normally these overlays are removed prior to the initial use of the device by the user and discarded.

Applicant has also recognized that conventional screen protection overlays are formed of a clear material so that the overlay does not obscure the matter displayed on the display screen in any way. Some protection overlays may include a polarized filter to block off-angle viewing of the display screen in order to enhance the privacy of use of the device, and/or increase the readability of the display screen in a bright environment such as sunlight.

Applicant has devised a screen protector article to be used on the display screen of a device while the device is being operated, but provides additional visual enhancement markings to the display in a non-permanent or temporary manner that may be visible during use of the device, or may be configured so that illumination of the display screen causes the markings to become virtually invisible. The screen protector article may also include markings that are located in zones of the display screen that are not capable of displaying output from the display screen, but simply form a peripheral area of the display screen that is not illuminated by the screen. Such areas may be utilized through the markings for displaying information, logos, decorative matter, and virtually anything else that may be desired.

Aspects of the disclosure relate to an article 10 for protecting a display screen 2 of an electronic device 1, such as a device used for communication (e.g., a cellular phone), computing (e.g., a tablet computer) or for other purposes such as entertainment (e.g., a music player, a device for executing software apps, and video game playing devices), as well as other devices that have a display screen. In many if not most implementations, the article is most useful for protecting a display screen that is subject to repeated contact by the user using a finger or a stylus (or other device) to provide input to the device. Such display screens are often referred to as "touch screens."

The display screen 2 may have a display surface 3 which is often formed by a transparent material, such as glass or other suitable material. The display screen may have a display zone 4 that is capable of displaying a changeable image corresponding to output by the device. The display zone typically occupies a majority of the display screen, and may in some cases occupy the entire display screen surface. However, as the display surface 3 of the display screen often covers a large portion of the front of a device, the display screen may also have a non-display zone 5 that includes portions of the device that are not able to actively present a changeable image. The border between the zones 4, 5 is illustratively shown as broken lines in FIG. 1, although the border usually may not be visible except when the display is fully illuminated. Typically, the display zone 4 of the display surface may be illuminated by an illumination source of the display screen (and the non-display zone or zones are typically not illuminated by the illumination source). The display screen 2 may have a periphery 6, and the device 1 may have a frame 7 that extends about or along the periphery of the display screen.

The article 10 may comprise a substrate 12 that is configured to cover at least a portion of the display surface of the display screen, and typically will cover substantially the entire display surface to protect the display surface from direct contact with items used for touch input, or just environmental objects that would otherwise would come into contact with the display surface and may leave scratches, smudges, or other debris. The substrate 12 may be substantially transparent to permit images displayed on the display surface to be visually transmitted through the substrate. The substrate may be clear, but could also be tinted. The substrate 12 may have a size and shape configured to cover substantially an entirety of the display surface, which may be accomplished by an article that is precut to fit the display screen of a particular device 1 or may be cut to size and shape by the consumer of the article. The substrate may be formed of a suitable material that provides the characteristics described herein, and may also have some flexibility although this is not critical. As one illustrative example, the substrate may be formed from a film which is urethane-based and may be 0.008 inches thick.

The substrate 12 may have a display region 14 that is configured to cover the display zone 4 of the screen 2 when the substrate is applied to the display surface 3. The substrate may also include a non-display region 16 that is configured to cover the non-display zone 5 of the screen when the substrate is applied to the display surface. The border between the regions 14, 16 is illustratively shown as broken lines in FIG. 1, although the border between the regions may not be visible to the user. The substrate 12 has a perimeter 18 which may be sized and shaped to generally correspond to the periphery 6 of the display screen. The perimeter being sized and shaped to meet the frame 7 about the display screen and may substantially abut against the frame about the display screen, although this is not critical. The substrate 12 may have an outer surface 20 that faces outwardly from the display surface when the substrate is applied to the display surface, and an inner surface 22 that faces toward the display surface when the substrate is applied to the display surface.

The article includes a marking 24, and may be provided on the substrate 12. The marking 24 may be located on the inner surface 22 of the substrate, but may also be located on the outer surface of the substrate (although such location may be vulnerable to transfer of the marking to other surfaces as well as being vulnerable to damage to the marking). The marking 24 may be located in the non-display region 16 of the substrate, and may be located in the display region 14 of the substrate. The marking 24 may be located on a marked area 26 of the substrate, and may include a plurality of marked areas of the substrate. The marked areas 26 may be located on the display 14 and non-display 16 regions of the substrate, and the marked areas may be located on both the inner 22 and outer 20 surfaces of the substrate.

In some implementations of the disclosure, some or all of the markings 24 may be of a character that is opaque to visible light transmitted by the illumination source of the display screen, and may thereby block the transmission of the visible light from the display surface in the marked area or areas such as in any direction or angle of viewing with respect to the display surface. In some implementations, some or all of the markings 24 may be of a character that permits partial transmission of visible light from the display surface through the marked area, and the marking may be partially transparent. The marking 24 may be of a character that blocks vision through the marked area to the display surface when the display surface is not illuminated by the source of illumination of the display screen and allows the passage of visible light through the marking from the source of illumination behind the display surface. One skilled in the art will recognize various techniques for producing a marked area with partial transmissibility, including, for example, by increasing or decreasing the density of the substance applied or surface treatment used to form the marking on the marked area.

The marking 24 may be formed on the substrate in any suitable manner or by any suitable process. In some of the most preferred implementations, the marking 24 is formed by an additive process, such as by printing on the substrate using a substance that dries on the surface (such as, for example, an ink) or fusing a substance to the substrate (such as, for example, a toner). Other suitable substances may be employed to form the markings using an additive approach. Other processes may be used to form the marking in the marked area, such by a subtractive process including etching the surface of the substrate. Markings may be formed by processes that do not involve substantially adding to or subtracting from the substrate, but include some manipulation of the substrate, such as by embossing raised or recessed areas into the substrate. The marking 24 may be of various colors, and may be reflective of visible light.

The substrate may be securable to the display surface of the display screen in any suitable manner. One means to hold the substrate to the surface may be static cling or static stick, a technique that is known to those skilled in the art of screen protectors, and provides easy removal and repositioning of the screen protector for a period of time. A suitable but somewhat less preferred manner of securing the substrate 12 to the display surface is through the use of a layer of adhering substance applied to at least a portion of the inner surface 22 of the substrate, and the layer may be continuous between the perimeter 18 of the substrate. In some embodiments, at least a portion of the adhesive may be applied over the marked area on the substrate. Preferably, the adhering substance produces a low level of adhesion between the substrate and the surface 3 so that peeling removal of the substrate from the display surface using finger-applied pulling force is possible.

In other aspects, the disclosure relates to a system 40 (see, for example, FIGS. 3 through 6) for adorning an electronic communication device 1 having a display screen 2 and the display screen may in turn have a display surface 3, with the display screen having a display zone 4 capable of displaying a changeable image and a non-display zone 5 incapable of displaying a changeable image. The display screen 2 may have a periphery 6. The device 1 may have an integral case 8 which may include a front face 9 with a frame 7 that extends about the periphery 6 of the display screen 2. The case may further include a rear face 11 located opposite of the front face 9, and the case may also include a perimeter case 13 that extends between the front and rear faces of the case 8, and the perimeter face may extend about the front and rear faces of the case. Various controls may be positioned on the perimeter face of the case, as well as on the front face 9 of the device.

The system 40 may include a screen protector article 32 for protecting the screen of the device as generally disclosed herein. In some embodiments, the article 10 may have a perimeter 34 that generally corresponds in shape and size to the perimeter 13 of the front face 9 of the case 8 such that the front face is substantially entirely covered by the article 32. The article 32 may include one or more apertures 36 to provide access to any buttons (such as a home button) for the device 1.

The system 40 may also include a device cover 42 for removably mounting on the device, and which may provide some protective function for the case 8 of the device, although this is not critical. The device cover 42 may be configured to cover the rear face 11 of the device case 8, and may also cover at least a portion of the perimeter face 13 of the case. In some embodiments, the cover may be configured for a snap fit relationship with the case of the device, and in some embodiments the device cover is formed of a single piece of material while in other embodiments the cover 42 may be formed of two or more pieces that may be connected together through a snap relationship. The device cover may have an exterior surface, and the exterior surface may include a rear exterior surface 44 generally positionable adjacent to the rear face 11 of the case, and a perimeter exterior surface 46 which is generally positionable adjacent to the perimeter face 13 of the case. The exterior surface of the device cover may have a substantially uniform color, and may be relatively undecorated.

The system may also include a plurality of decorative stickers 50 for adorning the device. Each sticker of the plurality of stickers may have a front surface 52 and a rear surface 54, and an adhesive 56 may be located on the rear surface 54 in order to adhere the sticker to a surface. The stickers 50 may mountable on the case of the device, and also may be mountable on the device cover 42 when the cover is employed to cover the case of the device. The front surface 52 of the stickers may have a decorative marking 58 located thereon. The front surface 52 of the stickers may be substantially flat in some embodiments, while in other embodiments the front surface may be contoured such that portions of the front surface extend a greater distance from the rear surface of the sticker than other portions. In some embodiments, each of the stickers may have similar markings located on the respective front faces of the stickers, while in other embodiments the markings may vary from sticker to sticker. In some embodiments, the markings may comprise or include a logo of an organization, such as a sports team, club, college or university, and the like. The sticker 50 may also have a perimeter 60 with a shape that may be a regular shape such as a circle, square, rectangle, or other regular geometric shape, while in other embodiments the shape of the perimeter 60 may be cut to correspond to an outer perimeter of a logo marked on the front surface 52. In some of the most preferred embodiments, the adhesive may comprise a pressure-sensitive adhesive that facilitates application of the sticker to a clean, dry surface and resists removal of the sticker from the surface once applied, although may not entirely prevent removal without significant effort.

The system may also include a carrier 70 for carrying the stickers prior to mounting on the device case or the device cover. The carrier may have a carrier surface 72 on which the stickers are removably adhered, and the carrier surface may be treated with a release substance that permits or facilitates peeling of the stickers from the carrier surface without significant effort. The carrier may be formed of a paperboard material, although other materials with a semi-rigid character may be employed. The carrier 70 may provide a means of holding and displaying the stickers, as well as a screen protector article 10 prior to purchase by a consumer and user, and the screen protector may be adhered to the carrier surface of the carrier and be peelable from the carrier surface. In some applications the carrier may be positioned in a clear or semi-transparent protective wrapper that may be positioned in a bin or hung from a rod at a point of sale for the system. A package including the carrier and stickers may also include the device cover 42 to provide a location for mounting the stickers without applying them directly to the device.

It should be appreciated that in the foregoing description and appended claims, that the terms "substantially" and "approximately," when used to modify another term, mean "for the most part" or "being largely but not wholly or completely that which is specified" by the modified term.

It should also be appreciated from the foregoing description that, except when mutually exclusive, the features of the various embodiments described herein may be combined with features of other embodiments as desired while remaining within the intended scope of the disclosure.

Further, those skilled in the art will appreciate that the steps shown in the drawing figures may be altered in a variety of ways. For example, the order of the steps may be rearranged, substeps may be performed in parallel, shown steps may be omitted, or other steps may be included, etc.

With respect to the above description then, it is to be realized that the optimum dimensional relationships for the parts of the disclosed embodiments and implementations, to include variations in size, materials, shape, form, function and manner of operation, assembly and use, are deemed readily apparent and obvious to one skilled in the art in light of the foregoing disclosure, and all equivalent relationships to those illustrated in the drawings and described in the specification are intended to be encompassed by the present disclosure.

Therefore, the foregoing is considered as illustrative only of the principles of the disclosure. Further, since numerous modifications and changes will readily occur to those skilled in the art, it is not desired to limit the disclosed subject matter to the exact construction and operation shown and described, and accordingly, all suitable modifications and equivalents may be resorted to that fall within the scope of the claims.

I claim:

1. A system for adorning an electronic communication device having a case including a display screen on a front face of the case, the case further including a rear face opposite of the front face, the system comprising:
    a carrier having a carrier surface;
    a plurality of decorative stickers for adorning the device, each sticker of the plurality of decorative stickers having a front surface and a rear surface, the rear surface having an adhesive for adhering the sticker to a surface, the adhesive of the stickers being adhered to the carrier surface of the carrier, the stickers being configured for mounting on the case of the device, the front surface of one of said stickers having a decorative marking thereon; and
    a screen protector article for protecting the screen of the device, the screen protector being adhered to the carrier surface of the carrier and being peelable from the carrier surface, the screen protector including:
        a substrate configured to cover the screen of the device during use of the device, at least a portion of the substrate being substantially transparent to permit viewing of the display surface through the substrate, the substrate having an inner surface for facing toward the display surface when the substrate is applied to the display surface and an outer surface for facing outwardly from the display surface when the substrate is applied to the display surface, the substrate being configured to be removably adhered to the display screen of the device and
        at least one marking positioned on the inner surface of the substrate applied with an adhering substance such that the marking is removably positioned between the substrate and the display surface and blocks a portion of a changeable image displayed on the display surface when the substrate is adhered to the display screen, and such that the at least one marking is removable from display on the display screen by peeling the substrate from the screen.

2. The system of claim 1 wherein the front surface of the at least one of the stickers is contoured.

3. The system of claim 2 wherein at least two of the stickers have similar markings on the respective front faces of the stickers.

4. The system of claim 2 wherein the marking comprises a logo of an organization.

5. The system of claim 1 additionally comprising a device cover for removably mounting on the device, the device cover being configured to cover the rear face of the device and at least a portion of the perimeter face of the device, the device cover having an exterior surface with a rear exterior surface and a perimeter exterior surface, the exterior surface being configured for having at least one of the stickers adhered thereto.

6. The system of claim 5 wherein the cover is configured to have a snap fit on the case of the device, the exterior surface having a substantially uniform color.

7. The system of claim 1 wherein the carrier surface has a release substance applied thereto to permit peeling of the stickers from the carrier surface.

8. The system of claim 1 additionally comprising an electronic device having a display screen with a display surface, the display screen having a display zone capable of displaying a changeable image and a non-display zone incapable of displaying a non-changeable image, the display zone being illuminable by a source of illumination of the display screen.

9. The system of claim 1 wherein the substrate has a size and shape configured to cover substantially an entirety of the display surface.

10. The system of claim 1 wherein the display screen of the device has a display zone capable of displaying a changeable image and a non-display zone incapable of displaying a non-changeable image; and
    wherein the substrate has a display region configured to cover the display zone of the screen when the substrate is applied to the screen and a non-display region configured to cover the non-display zone of the screen when the substrate is applied to the screen, the at least one marking being located in the display region.

11. The system of claim 1 wherein the display screen of the device has a display zone capable of displaying a changeable image and a non-display zone incapable of displaying a non-changeable image; and
    wherein the substrate has a display region configured to cover the display zone of the screen when the substrate is applied to the screen and a non-display region configured to cover the non-display zone of the screen when the substrate is applied to the screen, the at least one marking being located in the non-display region.

12. The system of claim 1 wherein the at least one marking is of a character that is opaque to visible light transmitted from the display screen.

13. The system of claim 1 wherein the at least one marking is of a character that permits partial transmission of visible light from the display surface.

14. The system of claim 1 wherein the at least one marking is formed by printing on one of the surface of the substrate.

15. The system of claim 1 wherein the at least one marking is formed by etching one of the surfaces of the substrate.

16. The system of claim 1 wherein the marking is formed by embossing one of the surfaces of the substrate.

17. The system of claim 1 additionally comprising:
- an electronic device having a display screen with a display surface, the display screen having a display zone capable of displaying a changeable image and a non-display zone incapable of displaying a non-changeable image, the display zone being illuminable by a source of illumination of the display screen;
- a device cover removably mounted on the electronic device, the device cover covering the rear face of the device and at least a portion of the perimeter face of the device, the device cover having an exterior surface with a rear exterior surface and a perimeter exterior surface.

18. The system of claim 17 wherein the substrate has a display region configured to cover the display zone of the screen when the substrate is applied to the screen and a non-display region configured to cover the non-display zone of the screen when the substrate is applied to the screen, the at least one marking being located in the display region.

* * * * *